United States Patent
Giraud et al.

(10) Patent No.: US 12,119,059 B2
(45) Date of Patent: Oct. 15, 2024

(54) WRITE METHOD FOR DIFFERENTIAL RESISTIVE MEMORIES

(71) Applicants: COMMISSARIAT A L'ENERGIE ATOMIQUE ET AUX ENERGIES ALTERNATIVES, Paris (FR); WEEBIT NANO LTD, Hod Hasharon (IL)

(72) Inventors: Bastien Giraud, Grenoble (FR); Cyrille Laffond, Grenoble (FR); Sebastien Ricavy, Grenoble (FR); Valentin Gherman, Grenoble (FR); Ilan Sever, Kfar Vitkin (IL)

(73) Assignees: COMMISSARIAT A L'ENERGIE ATOMIQUE ET AUX ENERGIES ALTERNATIVES, Paris (FR); WEEBIT NANO LTD, Hod Hasharon (IL)

(*) Notice: Subject to any disclaimer, the term of this patent is extended or adjusted under 35 U.S.C. 154(b) by 172 days.

(21) Appl. No.: 17/990,723

(22) Filed: Nov. 20, 2022

(65) Prior Publication Data
US 2023/0207006 A1   Jun. 29, 2023

(30) Foreign Application Priority Data
Dec. 23, 2021 (FR) ..................... 2114324

(51) Int. Cl.
*G11C 13/00* (2006.01)
*G11C 29/52* (2006.01)

(52) U.S. Cl.
CPC ........ *G11C 13/0069* (2013.01); *G11C 13/004* (2013.01); *G11C 29/52* (2013.01)

(58) Field of Classification Search
CPC .... G11C 13/0069; G11C 13/004; G11C 29/52
See application file for complete search history.

(56) References Cited

U.S. PATENT DOCUMENTS

| | | | | |
|---|---|---|---|---|
| 7,139,208 B2* | 11/2006 | Arimoto | ............... | G11C 29/006 365/230.06 |
| 9,679,664 B2* | 6/2017 | Ong | ................. | G06F 21/00 |
| 9,786,387 B2* | 10/2017 | Cha | ................. | G11C 29/52 |
| 2019/0333579 A1 | 10/2019 | Grossi et al. | | |

FOREIGN PATENT DOCUMENTS

WO   2021/016237 A1   1/2021

OTHER PUBLICATIONS

Hirtzlin, et al., "Hybrid Analog-Digital Learning with Differential RRAM synapses", 2019 IEEE International Electron Devices Meeting (IEDM), 2019.

* cited by examiner

*Primary Examiner* — Vanthu T Nguyen
(74) *Attorney, Agent, or Firm* — BakerHostetler

(57) ABSTRACT

A method is provided for writing a data word to a resistive memory consisting of 2T2R differential cells each having first and second sets of a resistor (R) and a selection transistor (T). The method includes generating an initial codeword, programming it in 1T1R mode, checking its programming in 1T1R mode, inverting it, programming the inverted initial codeword in 1T1R mode, checking its programming in 1T1R mode, and reading, in 2T2R differential mode, that the read data correspond to said initial data. A device designed to implement this write method and to an electronic system including this device is also provided.

12 Claims, 4 Drawing Sheets

WRITE METHOD FOR DIFFERENTIAL RESISTIVE MEMORIES

CROSS-REFERENCE TO RELATED APPLICATION

This application claims priority to foreign French patent application No. FR 2114324, filed on Dec. 23, 2021, the disclosure of which is incorporated by reference in its entirety.

FIELD OF THE INVENTION

The present invention relates to a write method for differential resistive memories having a 2T2R structure.

BACKGROUND

Resistive memories are non-volatile memories having a higher operating speed than flash NAND (SSD memory), low electrical energy consumption and a long lifetime. For these reasons, resistive memories are promising candidates for replacing both modern random access memories and modern non-volatile memories such as flash memories.

There are many resistive memory technologies. Mention may be made notably of conductor bridge-based resistive memories, also called CBRAM (for "Conductive-Bridging Random-Access Memory"), or oxide-based resistive memories, also called OxRAM (for "Oxide-based Random-Access Memory"), or else phase-change memories, also called PCM.

A resistive memory consists of a multitude of resistive memory cells arranged in rows and columns so as to form a matrix. An RRAM memory cell is equipped with at least one resistive element the electrical resistance of which is able to be modified.

An elementary resistive memory cell, as illustrated in FIG. 1a (with an exemplary associated readout device), generally consists of a transistor (T) and of a resistive component (R) or resistor (12), in which an information bit is encoded by the value of the electrical resistance of the resistor and accessed via the transistor at the intersection of a bit line (BL) and of a word line (WL). For these elementary cells, a logic '0' may for example be encoded by programming the resistor in a high-resistance state HRS, and a logic '1' may then be encoded by programming the resistor in a low-resistance state LRS, and reference is then made to encoding in 1T1R mode.

To program a memory cell, a programming voltage is applied between the electrodes of the memory cell. This may be a write voltage for writing to the memory cell, that is to say putting it into the low-resistance state LRS, or an erase voltage for erasing the memory cell, that is to say putting it into the high-resistance state HRS. However, after a programming operation, it may be the case that the memory cell does not change to the desired resistance state. For this reason, a check is generally performed to ensure that the memory cell is programmed correctly by comparing its resistance value R with a predefined resistance threshold $R_{REF}$.

However, the difference between the lowest value, corresponding to an HRS level, and the highest value, corresponding to the LRS level, also called "memory window", is often small. Therefore, "differential encoding" is commonly used to code a binary value to be stored. An information bit may then be encoded in what is called a 2T2R memory cell, consisting of two elementary 1T1R cells, comprising 2 transistors (2T) and 2 resistors (2R), and reference is then made to encoding in 2T2R mode. FIG. 1b illustrates one implementation variant of a 2T2R cell with a readout device for reading such a memory cell.

Since each of the HRS and LRS states may be associated with a logic value, that is to say '0' or '1', it may be considered that, in a 2T2R cell, one of the two resistive element encodes the bit to be programmed in the non-inverted version, while the other resistive element encodes the same bit in the inverted version. For example, a logic '0' is encoded by programming the resistor of the first 1T1R cell in a high-resistance state HRS and the resistor of the second 1T1R cell in a low-resistance state LRS, and a logic '1' is encoded by programming the resistor of the first 1T1R cell in a low-resistance state LRS and the resistor of the second cell in a high-resistance state HRS.

Thus, in differential encoding, each information bit is encoded in an elementary 2T2R cell formed of two resistive elements that are written to in state opposition, that is to say one of the resistive elements with an HRS level and the other with an LRS level, the respective resistance levels of the two resistive elements always being determined in the same order between the two elements, which define whether a logic '0' or a logic '1' is present depending on whether they correspond to the HRS-LRS or LRS-HRS states.

During an operation of writing to a 1T1R or 2T2R memory cell, it is necessary to ensure that each electrical resistance that is to be programmed to an HRS state or the LRS state is respectively either greater or less than a reference value $R_{REF}$. An electrical resistance is compared with the value $R_{REF}$ through a read operation in which the programmed resistance is compared with the value $R_{REF}$ using a detection amplifier or SA (for "Sense Amplifier"), illustrated by the component 14 in FIG. 1a, 24 in FIG. 1b, and 34 in FIG. 1c. This read operation with comparison with a reference value is hereinafter called 1T1R mode.

In FIG. 1a, the detection amplifier 14 reacts to the difference between its two inputs 'SL' (coming from the 1T1R cell) and 'ref' (representative of a reference electrical resistance value $R_{REF}$), to generate an output signal 'Vout', which indicates the resistive state of the memory element of the cell and thus provides information about the value that is stored in the 1T1R cell.

In FIG. 1b, the detection amplifier 24 is sensitive to the difference between its inputs, to generate an output signal 'Vout'. Two multiplexers (23-1, 23-2) are respectively connected, at a first input, to each line SL (SL1, SL2) connected to a 1T1R cell (22-1, 22-2). The second input of each multiplexer is connected to a reference resistor $R_{REF}$. The outputs of the multiplexers are respectively connected to the inputs of the detection differential amplifier 24. This diagram is highly symbolic and does not show all of the electronic elements needed to perform a read operation and that are well known to a person skilled in the art (notably the circuits for biasing the elementary cells and the reference resistor). This simplified diagram makes it possible to illustrate a number of possible read principles for differential cells. Thus, when the two multiplexers are configured to let through the signals present on the lines SL1 and SL2, the amplifier 24 evaluates a difference in resistance between the two resistive elements of the 2T2R cell (respectively, the difference between 22-1 and 22-2), thus providing information about the value that is stored in the selected differential pair of the 2T2R cell. When it is desired to read a single 1T1R cell, and return to the read mode shown in FIG. 1a, the multiplexers are positioned so as to let through one line SL1 or SL2 on one of the multiplexers and to let through the signal linked to the reference resistor on the other of the multiplexers.

The read operations performed in the resistive memories are generally performed in 1T1R mode. To read the data from the RRAM cell, a small readout voltage that does not interfere with the current state of the cell is applied in order to determine the logic state of the cell.

In memories in which information is encoded in 2T2R mode, read operations, apart from that of checking programming, may be performed in 2T2R mode, also called reading in differential mode. The values of the two resistors present in each 2T2R memory cell that is addressed are compared with one another using a detection amplifier SA.

One technique for reading a datum stored in a 2T2R memory cell is described in the document: "Hybrid Analog-Digital Learning with Differential RRAM synapses" by Bocquet et al. IEDM19-534. It uses a readout circuit equipped with a locking detection amplifier that, during a read operation, is coupled to the differential pair of resistive elements by way of a pair of bit lines and is equipped with nodes the potentials of which toggle as a function of values of a current passing through the resistive elements. This type of detection amplifier is implemented with few transistors and operates as a high-gain differential current amplifier. It makes it possible to directly compare currents that pass through the resistive elements and flow via bit lines.

Given that the resistive elements keep their respective values even after the applied voltage has been removed, the RRAM resistive memory falls within non-volatile memories. However, the use of a memory involves frequent transitions between a high-resistance state (HRS) and a low-resistance state (LRS) and vice versa, and each event of switching between these resistive states may introduce damage, the programmed resistance values possibly changing due to relaxation phenomena and then leading to worsening of the performance of the RRAM.

The retention time of information in a resistive memory then depends on (a) read and write operations, (b) usage temperatures and/or (c) high magnetic fields in the case of magnetic memories.

In addition, switching voltages are also parameters that exhibit a high degree of variation. Resistor switching variations comprise temporal fluctuations (cycle to cycle) and spatial fluctuations (device to device).

Moreover, resistive memories also exhibit cell-to-cell non-uniformity, which also worsens the performance of the memory by reducing the memory margin between two states. The origin of this variability is attributed to non-uniformities in the fabrication process, such as the thickness of the switching film, damage caused by etching and the surface roughness of the electrodes.

These variations mean that the resistances of the resistive memories that are programmed in the LRS state may drift to an HRS state, and the resistances that are programmed in the HRS state may drift to an LRS state. Therefore, this sliding of the programmed resistance values may cause errors during read operations and diminish the performance of the memories.

One common way of improving the performance of RRAM memories is to reduce their error rate. To reduce the error rate of the memories, one commonly used solution is to use an error correction code or ECC, which encodes the data before they are written to memory. Generally, the ECC encoder is located inside or close to the memory controller. When data are encoded with an ECC code, check bits are added to the data bits, the check bits representing redundant information computed based on data bits that makes it possible to detect and correct errors affecting both the data bits and the check bits. The set of data bits and check bits forms a codeword.

The use of 2T2R resistive memories, which in theory have a read window that is twice as large, makes it possible to reduce the error rate and the need to use an expensive correction code. The efficiency of differential encoding is greater if each resistor used for differential encoding is programmed in 1T1R mode, that is to say in a mode in which it is necessary to guarantee that, if the value of the resistance is to be in the HRS/LRS state, then it is far greater/smaller than a reference value $R_{REF}$. However, this last constraint makes the operation of writing to a resistive memory more difficult and more time-consuming.

In 2T2R resistive memories, a write operation uses significantly more energy than a read operation and, moreover, it impacts the performance of the memory cells, far more so than a read operation does. Faced with this problem of loss of performance, there is a need for a solution for avoiding or reducing write operations to 2T2R resistive memories.

SUMMARY OF THE INVENTION

The invention aims to overcome all or some of the abovementioned problems by proposing a write method for 2T2R resistive memories that is less constrictive and also faster. This write method makes it possible to guarantee the functionality of the resistive memory in spite of the intrinsic variability of write operations for resistive memories.

To this end, one subject of the invention is a method for writing a data word to a resistive memory consisting of 2T2R differential cells each comprising first and second sets of a resistor (R) and a selection transistor (T), the method comprising steps of: generating an initial codeword from initial data bits and from check bits generated from the data word, and initializing a counter for counting a number of programming operations, the number of programming operations corresponding to a maximum number of programming operations for said word in a group of selected differential cells; programming this initial codeword in the resistive memory in 1T1R mode, by selecting the first 1T1R sets of the selected differential cells, and then performing a 1T1R check read operation and incrementing or decrementing the counter for counting the number of programming operations; repeating the previous step for as long as all of the bits of the initial codeword have not been correctly programmed and the maximum number of programming operations has not been reached; inverting the initial codeword and reinitializing the counter for counting the number of programming operations; programming the initial codeword inverted in the previous step in the resistive memory in 1T1R mode, by selecting the second 1T1R sets of the selected differential cells, and then performing a 1T1R check read operation and incrementing or decrementing the counter for counting the number of programming operations; repeating the previous step for as long as all of the bits of the inverted initial codeword have not been correctly programmed and the maximum number of programming operations has not been reached; performing a check read operation in 2T2R differential mode on the selected differential cells and checking at least that the read data correspond to said initial data: and, depending on the result of the check, terminating the write method or signalling an error in the write method.

In one embodiment, said check read operation in 2T2R differential mode includes checking all of the read bits of the codeword against the bits of the initial codeword.

In one embodiment, the step of repeating the previous step (programming this initial codeword in the resistive memory in 1T1R mode) comprises the following sub-steps of: checking, by reading the resistive memory in 1T1R mode, whether there are still unprogrammed data bits and check bits; and if there are still unprogrammed bits and if the maximum number of write operations to memory for said initial codeword has not been reached, repeating the step of programming said initial codeword in the resistive memory in 1T1R mode; or if there are not still unprogrammed bits or if the maximum number of write operations to memory for said initial codeword has been reached, continuing with the following step.

In one embodiment, the step of repeating the previous step (if there are still unprogrammed bits and if the maximum number of write operations to memory for said initial codeword has not been reached) comprises the following sub-steps of: checking, by reading the resistive memory in 1T1R mode, whether there are still unprogrammed data bits and check bits of the inverted initial codeword; and if there are still unprogrammed bits and if the maximum number of write operations to memory for said inverted initial codeword has not been reached, repeating the step of programming said inverted initial codeword in the resistive memory in 1T1R mode; or if there are not still unprogrammed bits or if the maximum number of write operations to memory for said inverted initial codeword has been reached, continuing with the following step (performing a check read operation in 2T2R differential mode on the selected differential cells and checking at least that the read data correspond to said initial data).

In one embodiment, the step of repeating the previous step (programming the initial codeword inverted in the previous step in the resistive memory in 1T1R mode) comprises the following sub-steps of: checking, by reading the resistive memory in 1T1R mode, whether there are still unprogrammed data bits and check bits of the inverted initial codeword; and if there are still unprogrammed bits and if the maximum number of write operations to memory for said inverted initial codeword has not been reached, repeating the step of programming said inverted initial codeword in the resistive memory in 1T1R mode; or if there are not still unprogrammed bits or if the maximum number of write operations to memory for said inverted initial codeword has been reached, continuing with the following step (performing a check read operation in 2T2R differential mode on the selected differential cells and checking at least that the read data correspond to said initial data).

In one embodiment, the step of terminating the write method is performed if the data read in 2T2R mode correspond to said initial data; and the step of signalling an error in the write method is performed if the data read in 2T2R mode do not correspond to said initial data.

In one embodiment, the step of programming the initial codeword in the resistive memory in 1T1R mode and/or the step of programming the inverted initial codeword in the resistive memory in 1T1R mode comprises substeps of: reading, in 1T1R mode, from the resistive memory, the bits at the programming address of the codeword and comparing the bits read at said programming address and the bits of the codeword to be programmed, and programming, in 1T1R mode, in the resistive memory, only the bits of the codeword that do not correspond to the read bits.

In one embodiment, the step of programming the initial codeword in the resistive memory in 1T1R mode or the step of programming the inverted initial codeword in the resistive memory in 1T1R mode are performed by a single write circuit designed to configure the cells of the resistive memory in an HRS or LRS state.

In one embodiment, the step of programming the initial codeword in the resistive memory in 1T1R mode and/or the step of programming the inverted initial codeword in the resistive memory in 1T1R mode are performed by a first write circuit designed only to configure the cells of the resistive memory in an HRS state and, in parallel, by a second write circuit designed only to configure the cells of the resistive memory in an LRS state.

In one embodiment, the step of programming the initial codeword in the resistive memory in 1T1R mode and/or the step of programming the inverted initial codeword in the resistive memory in 1T1R mode are performed firstly by the first write circuit concerning the cells of the resistive memory to be programmed in an HRS state and then performed secondly by the second write circuit concerning the cells of the resistive memory to be programmed in an LRS state, or vice versa.

The invention also relates to a device for writing a data word to a resistive memory consisting of 2T2R differential cells each comprising first and second sets of a resistor (R) and a selection transistor (T), the device comprising means for implementing the steps of the write method of the invention.

In one embodiment, the means of the device for writing a data word comprise a memory controller coupled to the resistive memory for implementing the check read operation in 2T2R differential mode step of the write method of the invention.

In one embodiment, the means of the device for writing a data word comprise a host processor coupled to the resistive memory designed to implement the check read operation in 2T2R differential mode step of the method of the invention.

BRIEF DESCRIPTION OF THE DRAWINGS

Other features, details and advantages of the invention will become apparent upon reading the description given with reference to the appended drawing, which is given by way of example and in which.

DETAILED DESCRIPTION

A write operation to 2T2R resistive memories requires the programming of two resistors.

Figure 1A:
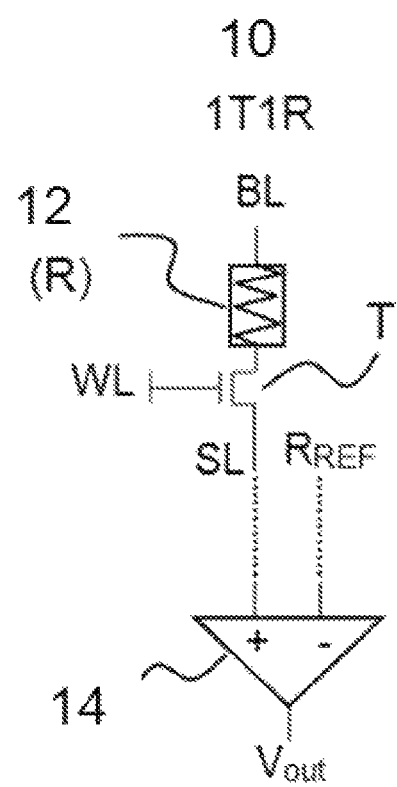
FIG. 1a and FIG. 1b illustrate implementations of a 1T1R memory cell and a 2T2R memory cell, respectively.
Figure 1B:
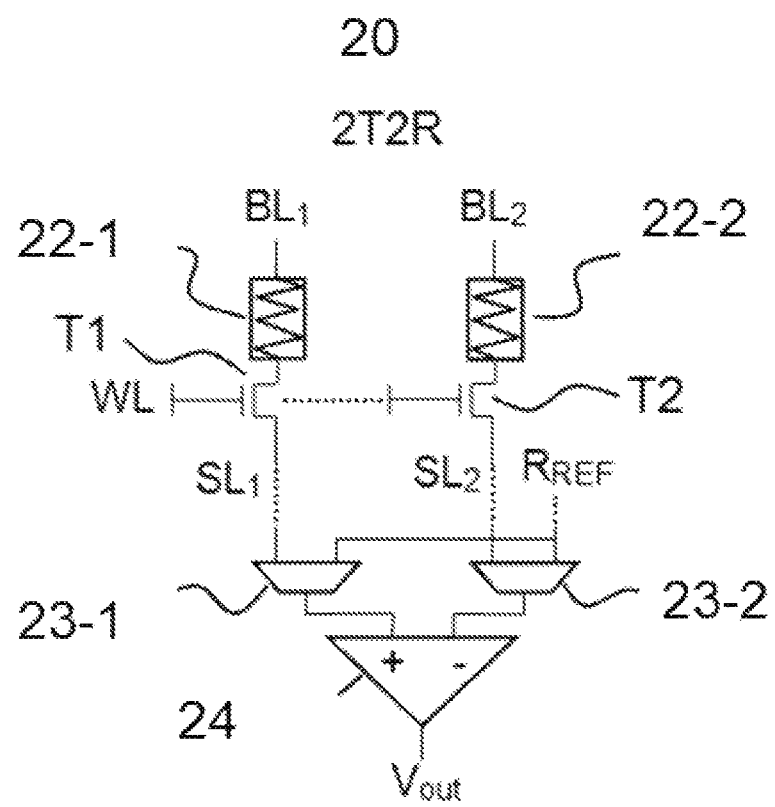

A write operation to a 2T2R resistive memory, such as the 2T2R resistive memory 430 from FIG. 1, allows differential encoding, which may be performed by programming the codeword, in 1T1R mode, a first time as it was generated, in order to write to the "left-hand" cells 22-1, and a second time, in a complementary manner, in order to write to the "right-hand" cells 22-2.

Figure 2:
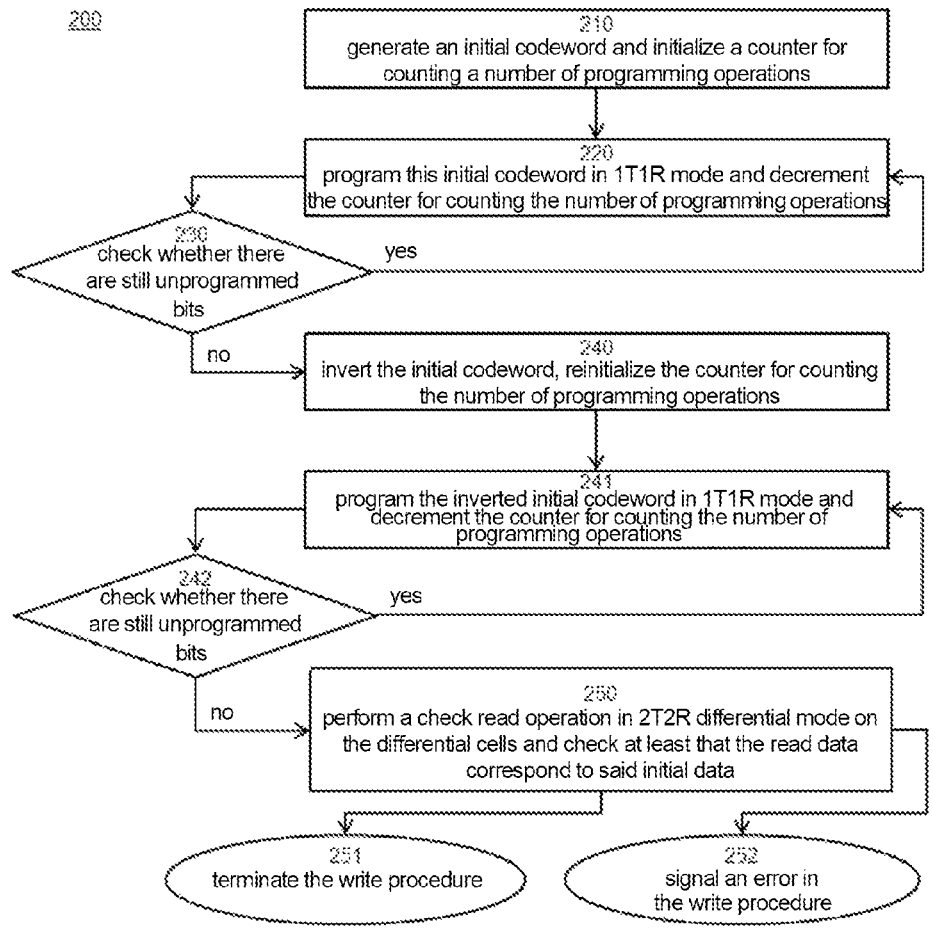
FIG. 2 shows the steps of a method for writing a data word to a resistive memory consisting of 2T2R differential cells according to one embodiment of the invention.

FIG. 2 shows a method 200 for writing a data word to a 2T2R resistive memory according to one embodiment of the invention. During the initiation of the write method, the initial data bits that are to be written are firstly encoded by an encoder ECC, during the step 210 of generating an initial codeword. Also in this step 210, a counter is initialized with a maximum number of programming operations. For example, the maximum number of programming operations may be 10 units, the counter starting at 10 and being decremented by one unit upon each programming operation until reaching 0, in which case no further programming operations are available. As an alternative, the maximum number of programming operations may be 10 units, the counter starting at 0 and being incremented by one unit upon each operation until reaching 10, in which case no further programming operations are available.

The write method 200 continues with a step 220 of programming the initial codeword in the resistive memory in a 1T1R write mode. In practice, it is the "left-hand" cells of each differential cell that are written to in 1T1R mode. This programming step 220 also comprises decrementing the programming counter. The programming counter is decremented or incremented upon each new step of programming data bits.

After programming step 220, a step 230 of reading in 1T1R mode using the address of the initial codeword that has just been programmed is performed. Likewise, it is the "left-hand" cells of each differential cell that are read in 1T1R mode. These two programming and reading steps 220, 230 correspond to an operation generally called WRITE/VERIFY, making it possible to check whether there are still unprogrammed bits of a codeword after it has been programmed.

In the affirmative, that is to say if data bits and/or check bits have not been programmed, and if the maximum number of write operations to memory has not yet been reached according to the counter for counting the number of programming operations for said initial codeword, programming step 220 is reiterated (yes branch of 230). Upon each reiteration of a programming step 220, the number of programming operations of the counter is incremented only if it has already been incremented in the first programming operation. As an alternative, the number of programming operations of the counter is decremented if it has already been decremented in the first programming operation.

This cycle of steps 220, 230 is performed as many times as needed until the data bits and check bits of the initial codeword are all programmed or else for as long as the maximum number of write operations to memory has not been reached according to the counter for counting the number of programming operations for said initial codeword.

If all of the bits of the initial codeword or if the maximum number of write operations has been reached (no branch of 230), the method continues with the following step 240 of inverting the initial codeword and of reinitializing the counter for counting the number of programming operations.

The write method 200 continues with a step 240 of inverting the initial codeword, making it possible to obtain a new word and to reinitialize the counter for counting the number of programming operations. Inverting the initial codeword is understood to mean that each data bit and check bit of the initial codeword is inverted, the logic values '1' becoming '0' and vice versa.

The write method 200 then continues with a step 241 of programming the bits of the inverted initial codeword in a 1T1R write mode. In practice, this time, it is the "right-hand" cells of each differential cell that are written to in 1T1R mode. This programming step 241 also comprises decrementing the programming counter. After this programming step 241, a step 242 of reading in 1T1R mode, at the memory address that has just been programmed, is performed. In this case too, it is the "right-hand" cells of each differential cell that are read in 1T1R mode. These two programming and reading and checking steps 241, 242 also correspond to an operation generally called WRITE/VERIFY, making it possible to check whether there are still unprogrammed bits of the inverted initial codeword after it has been programmed.

When programming the data bits and check bits of the inverted initial codeword (or complementary word) in 1T1R mode, the programming address is generally incremented so as to correspond to the complementary address of each 2T2R resistive memory cell for which the data bits and check bits of the initial codeword should have been programmed in programming step 220 (for the "left-hand" cells). The complementary address thus corresponds to the "right-hand" resistors complementary to the "left-hand" resistors for which programming has already been performed (or attempted if a programming error occurred).

Returning to step 242, in the affirmative, where data bits and check bits of the inverted initial codeword have not been programmed, and if programming operations are still available, that is to say if the maximum number of write operations to memory has not yet been reached according to the counter for counting the number of programming operations for said inverted initial codeword, programming step 241 is reiterated (yes branch of 242).

This cycle of steps 241, 242 is performed as many times as needed until the bits of the inverted initial codeword are all programmed or else the maximum number of write operations to memory has been reached according to the counter for counting the number of programming operations for said inverted initial codeword, in which case (no branch of 242) the write method continues with the following step 250, which consists of a check read operation in 2T2R differential mode on the selected differential cells and an operation of checking at least that the read data correspond to said initial data. This check is used to determine whether the differential read operation in 2T2R mode on the bits that were programmed in the previous steps makes it possible to read data that correspond to the initial data for which the write method was performed. If the data read in 2T2R mode correspond to the initial data, then the write method may be terminated 251. If the data read in 2T2R mode do not correspond to the initial data, then an error in the write method is signalled 252.

Advantageously, the step 240 of inverting the initial codeword followed by the step 241 of programming the inverted initial codeword in 1T1R mode are performed without any other operation of writing and of checking the initial codeword that was programmed in 1T1R mode in the previous step 220 of programming the initial codeword.

The write method of the present invention makes it possible to override failures or programming errors in 1T1R mode when programming an initial codeword or this initial codeword in an inverted form. Indeed, although it is common in the technical field of resistive memories to check the correct programming of data bits and check bits after each write operation, it is also common not to continue such write operations for as long as all of the bits are not programmed.

Thus, if, in the field, a limit on the maximum number of programming operations is already known, this maximum number of programming operations is determined so as to ensure sufficient reliability of programming in 1T1R mode, and therefore a sufficient number of programming cycles.

The inventors have established that the method for writing a codeword to a resistive memory consisting of 2T2R cells of the present invention is able to at least partially overcome this level of reliability of programming in 1T1R mode that is required in the art. Indeed, the method of the present invention is based on doubling the read margin when this read operation is performed in differential mode, thereby making it possible to reduce the repetition of write procedures while still keeping a sufficient level of reliability. In other words, the maximum number of write iterations in 1T1R mode in the present invention is chosen to be lower than the maximum number of write iterations in 1T1R mode that is generally used in devices from the prior art.

The write method of the present invention thus makes it possible to maximize the chances of correct reading of a codeword, while the maximum number of programming operations is reduced. Therefore, the write method of the present invention makes it possible to optimize the performance and the reliability of a resistive memory in 2T2R mode, while going against the desire for reliability of the programming operations performed in 1T1R mode.

In one particular case concerning writing for resistive memories in 2T2R mode in which the write method 200 does not involve writing data bits forming a whole word but only a subdivision of this whole word, it is necessary beforehand to read the whole word from the memory address targeted by the write operation 200, to correct any storage or read errors using the ECC decoder and to include the subdivision of the word to be written in the potentially corrected whole word. The write method 200 may then be performed in the first step 210 of generating a codeword from data bits corresponding to the corrected and modified word.

Figure 3:
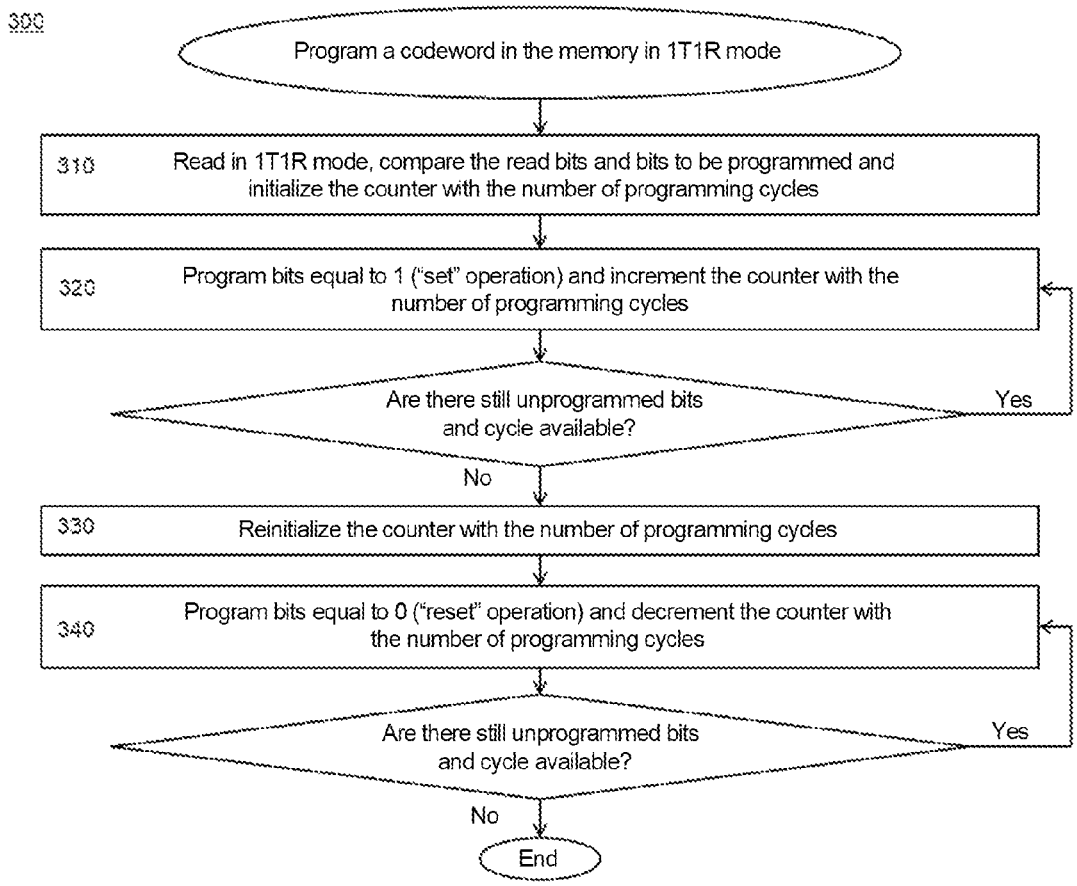
FIG. 3 shows one particular embodiment of the step of programming an initial codeword in a resistive memory in 1T1R mode.

FIG. 3 shows one particular embodiment of a method 300 of programming a word in a resistive memory in 1T1R mode. The method 300 for programming a word in the 1T1R memory may be applied for the step 220 presented in FIG. 2 of programming the bits of the initial codeword generated in the resistive memory in a 1T1R mode and also for step 241 of programming the bits of the inverted initial codeword in the resistive memory and in a 1T1R mode.

The programming of a word in the memory in 1T1R mode according to FIG. 3 begins with a step 310 of reading, in 1T1R mode, from the resistive memory, the bits at the programming address and comparing the bits read at said programming address and the bits of the word to be programmed. Through this comparison, it is possible to determine which read bits have already been programmed correctly for the word that is to be programmed and which ones have not been programmed correctly.

Following this step 310, the programming 300 continues with a step 320 of programming, in 1T1R mode, in the resistive memory, only the bits that do not correspond to the bits of the word to be programmed. Notably, in the particular embodiment of FIG. 3, only the bits that were not equal to '1' are programmed, and the bits that were already programmed at '1' are not programmed. This step is also known as a "set" operation. Also, during this programming operation, the counter for counting the number of programming operations is decremented.

This step 310 of reading and then programming the bits that are only equal to '1' corresponds to a step known as "READ BEFORE WRITE", which makes it possible to save on programming cells that do not need to be programmed.

The programming of a codeword in the memory in 1T1R mode according to FIG. 3 continues with a step of checking, by reading the programming address in the resistive memory in 1T1R mode, whether there are still unprogrammed bits at '1'. This step corresponds to steps 230 and 242 from FIG. 2.

The programming of a word in the memory in 1T1R mode according to FIG. 3 continues with a step 340 of programming, in 1T1R mode, in the resistive memory, the bits of the codeword that are equal to '0' and that do not correspond to the read bits. Notably, in the particular embodiment of FIG. 3, the data bits that were already programmed at '0' are not modified. This step is also known as a "reset" operation. Also, during this programming operation, the counter for counting the number of programming operations is decremented.

The programming of a codeword in the memory in 1T1R mode according to FIG. 3 continues with a step of checking, by reading the programming address in the resistive memory in 1T1R mode, whether there are still unprogrammed bits at '0'. This step also corresponds to steps 230 and 242 from FIG. 2, which are thus doubled, one step being performed for each operation, one being a "set" step and one being a "reset" step.

One particular embodiment of a write method according to the present invention involves performing the write method shown by FIG. 2, steps 220 and 241 of programming in the resistive memory in 1T1R mode being performed according to FIG. 3, this particular embodiment not comprising a step of checking unprogrammed bits performed just after step 320 of programming bits equal to 1, and/or a step of checking unprogrammed bits performed just after step 340 of programming bits equal to 0.

In another particular embodiment of the invention, which may be combined with the embodiments described above, the device implementing the method 300 for writing to a resistive memory in 1T1R mode comprises a first write circuit designed only to configure the cells of the resistive memory in an HRS state and a second write circuit designed only to configure the cells of the resistive memory in an LRS state. In this particular embodiment, step 320 of programming bits equal to 1 ("set" operation used to program the cells in the LRS state) and step 340 of programming bits equal to 0 ("reset" operation used to program the cells in the HRS state) are performed in parallel, that is to say at the same time by the first write circuit concerning the cells of the resistive memory to be programmed in an HRS state and by the second write circuit concerning the cells of the resistive memory to be programmed in an LRS state. Such an embodiment makes it possible notably to save write time, data bits being able to be programmed by two write circuits at the same time in each programming step.

In another particular embodiment of the invention, the device implementing the method 200 for writing to a resistive memory consisting of 2T2R differential cells comprises a single write circuit designed to configure the cells of the resistive memory in an HRS or LRS state. In comparison with the embodiments in which the device implementing the write method 200 of the invention comprises two write circuits, a device comprising a single write circuit makes it possible to save on area and to reduce the static consumption in the implementation of this device. It will be noted that this "single" write circuit, since it is capable of programming "0"s and "1"s, in practice often consists of multiple write circuits associated for example with different columns of memory cells, in order to be able to perform multiple write operations in distinct memory cells in parallel.

Moreover, it will be noted that writing to memory cells associated with a codeword, in a manner known per se, is conventionally carried out in a group of selected memory cells based on one and the same address value that is provided by the host processor, the number of selected memory cells being for example equal to k+r (k being the size of the data and r the number of ECC bits). Thus, when a read operation is performed in "2T2R" differential mode at an address indicated by the processor, a plurality of parallel differential read operations on the memory cells associated with the indicated address are performed in practice.

Some types of memory device may be configured to store data in "single" cells or "differential" cells, with the possibility of doubling the size of the memory if the data are stored in single mode. Thus, the range of addresses provided for this type of memory is that corresponding to the maximum storage space, in 1T1R storage configuration, and this corresponds in practice to an addressing space double that needed for a memory operating only in 2T2R storage mode. When such a dual storage mode device is configured 1T1R storage mode, then write operations and read operations are always all performed in 1T1R read mode, and of course only in 1T1R write mode. It is only when such a memory device is configured in 2T2R storage mode that a cell is written to as described above with 1T1 R programming operations in order to program the "left-hand" cells and then the "right-hand" cells and finally by performing a 2T2R differential read operation if necessary in order to exit the cycle of write operations, possibly without any error if the differential read operation is correct.

With a dual storage mode memory device, the reading of the left-hand and then right-hand cells in 1T1 R mode is reflected by the host processor producing two different successive addresses, which may for example differ only by one address bit (thus signifying "left-hand" or "right-hand").

According to one variant embodiment, the selection of the "left-hand" or "right-hand" cells may also be transparent to the host processor and provided by the memory controller. The host processor may thus request a write operation to a given address, and it is the memory controller that will take responsibility for performing the entire iterative method of write operations/check read operations and that will therefore take responsibility for controlling the devices for selecting rows/columns of the memory matrix in order to select either the left-hand cells or the right-hand cells in the phases of writing and reading in 1T1R mode. In other words, from outside the memory device, the processor is able to see only differential write operations to and read operations from a selection address, and it is the memory controller that performs all of the substeps forming a write operation requiring the change to 1T1R mode.

Thus, in the case of having a memory device that is not a dual mode storage device, the selection of the "left-hand" or "right-hand" cells may be managed by the memory controller, transparently to the host processor as explained above.

Figure 4:
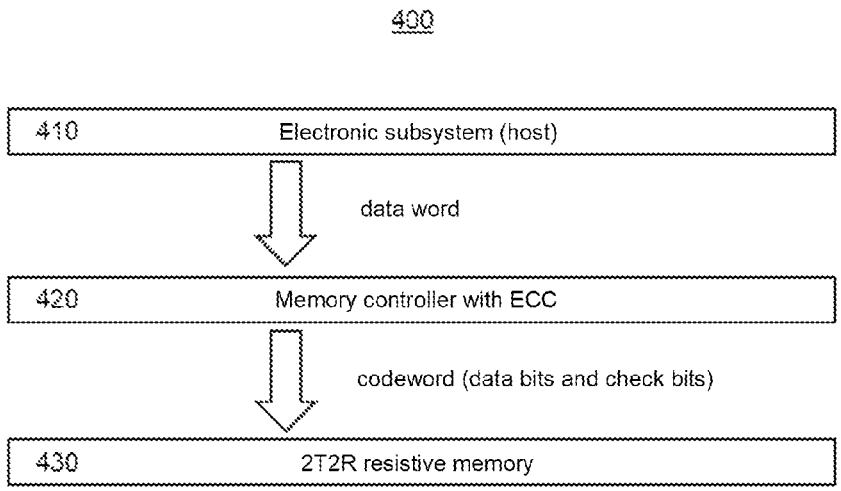
FIG. 4 shows a general system for implementing the steps of a method for writing a data word to a resistive memory consisting of 2T2R differential cells according to one embodiment of the invention.

FIG. 4 shows a general system 400 for implementing the steps of a method for writing to a resistive memory consisting of 2T2R differential cells according to one embodiment of the invention, which comprises an electronic subsystem 410, also called host electronic subsystem or host processor, a memory controller 420 comprising an encoder and decoder for an error correction code (ECC) and a 2T2R resistive memory 430. The host electronic subsystem may comprise one or more processor cores, a microcontroller or a programmable logic circuit, also called FPGA (acronym for "Field-Programmable Gate Array"). In addition or as an alternative, the host subsystem may correspond to an ASIC (acronym for "Application-Specific Integrated Circuit") integrated circuit. During an operation of writing a word to a resistive memory such as that contained in the computing system 400, data bits of this word are issued by the electronic subsystem 410 and sent to the memory controller 420. The data bits of a word issued by the electronic subsystem 410 are first used by the encoder ECC, which will generate check bits that are added to the string of data bits so as to form a codeword. These check bits will be stored at the same address in the resistive memory consisting of 2T2R differential cells 430 as the data bits of the same word. These check bits may notably be used by a decoder ECC to correct any errors in storing a word in the resistive memory in 2T2R mode 430 during the reading phase. The data bits and the check bits then form a codeword that is to be programmed in the cells of the 2T2R resistive memory 430.

In the example of the method described in relation to FIG. 2, in step 250, a check read operation in 2T2R differential mode is performed on the selected differential cells, and it is checked at least that the read data correspond to said initial data. This assumes that this check is performed inside the memory device by the memory controller. The memory controller then has direct access to the data provided by the reading devices that read the data bits and the ECC bits, that is to say has access to the bits that are sent to the decoder present in the memory device in order to correct any errors before taking out only the possibly corrected data bits. The memory controller may then detect programming difficulties in the data bits or the ECC bits and thus identify bits that have been incorrectly programmed more precisely, in order then to be able to focus on these single bits that are more difficult to program in programming iteration phases.

According to one variant embodiment, it is possible for the last step 250 to be performed differently, considering only the data leaving the decoder ECC. This variant may notably be contemplated if it is the host processor that performs the final check makes the final decision to accept or not accept the write operation.

It is also possible to contemplate a combination of the two variants, specifically a check on the codeword performed by the memory controller with a flag being raised for the processor in the event of an error detected on the codeword, followed by checking of the data read by the processor, which may possibly decide to validate the write operation anyway if the read data are not exact, even if this required using the correction mechanism provided by the decoder.

One advantage of using a check on the codeword performed by the memory controller is that it is possible to ensure that the write operation was satisfactory enough to have a written word that does not require ECC correction by the decoder. This makes it possible to leave a greater margin for correction by the ECC in order to deal with errors that may interfere in the memory over time. Nevertheless, if the programmer of the application executed by the processor considers that the data will not be kept very long, it is possible to make do with a less "reliable" write operation that however gives correct data in a subsequent read operation due to the ECC correction. In this case too, this is a compromise between reliability and write time that may be adjusted depending on the application that is executed.

The present description illustrates one preferred implementation of the invention, this implementation however not being limiting. Some examples are chosen to allow a good understanding of the principles of the invention and a specific application, but are in no way exhaustive and are intended to allow a person skilled in the art to make modifications and suggest implementation variants while keeping the same principles. Thus, for example, the various methods described may be implemented within one and the same device.

The invention claimed is:

1. A method for writing a data word to a resistive memory consisting of 2T2R differential cells each comprising first and second sets of a resistor (R) and a selection transistor (T), the method comprising steps of:
generating an initial codeword from initial data bits and from check bits generated from the data word, and initializing a counter for counting a number of programming operations, the number of programming operations corresponding to a maximum number of programming operations for said word in a group of selected differential cells;
programming this initial codeword in the resistive memory in 1T1R mode, by selecting the first 1T1R sets of the selected differential cells, and then performing a 1T1 R check read operation and incrementing or decrementing the counter for counting the number of programming operations;
repeating the previous step for as long as all of the bits of the initial codeword have not been correctly programmed and the maximum number of programming operations has not been reached;
inverting the initial codeword and reinitializing the counter for counting the number of programming operations;
programming the initial codeword inverted in the previous step in the resistive memory in 1T1R mode, by selecting the second 1T1R sets of the selected differential cells, and then performing a 1T1R check read operation and incrementing or decrementing the counter for counting the number of programming operations;
repeating the previous step for as long as all of the bits of the inverted initial codeword have not been correctly programmed and the maximum number of programming operations has not been reached;
performing a check read operation in 2T2R differential mode on the selected differential cells and checking at least that the read data correspond to said initial data; and, depending on the result of the check,
terminating the write method or
signalling an error in the write method.

2. The method for writing a data word to a resistive memory consisting of 2T2R differential cells according to claim 1, wherein said check read operation in 2T2R differential mode includes checking all of the read bits of the codeword against the bits of the initial codeword.

3. The method for writing a data word to a resistive memory consisting of 2T2R differential cells according to claim 1, wherein the step of repeating the previous step comprises the following sub-steps of:
checking, by reading the resistive memory in 1T1R mode, whether there are still unprogrammed data bits and check bits; and
if there are still unprogrammed bits and if the maximum number of write operations to memory for said initial codeword has not been reached, repeating the step of programming said initial codeword in the resistive memory in 1T1R mode; or
if there are not still unprogrammed bits or if the maximum number of write operations to memory for said initial codeword has been reached, continuing with the following step.

4. The method for writing a data word to a resistive memory consisting of 2T2R differential cells according to claim 1, wherein the step of repeating the previous step comprises the following sub-steps of:
checking, by reading the resistive memory in 1T1R mode, whether there are still unprogrammed data bits and check bits of the inverted initial codeword; and
if there are still unprogrammed bits and if the maximum number of write operations to memory for said inverted initial codeword has not been reached, repeating the step of programming said inverted initial codeword in the resistive memory in 1T1R mode; or
if there are not still unprogrammed bits or if the maximum number of write operations to memory for said inverted initial codeword has been reached, continuing with the following step.

5. The method for writing a data word to a resistive memory consisting of 2T2R differential cells according to claim 1, wherein the step of terminating the write method is performed if the data read in 2T2R mode correspond to said initial data; and wherein the step of signalling an error in the write method is performed if the data read in 2T2R mode do not correspond to said initial data.

6. The method for writing a data word to a resistive memory consisting of 2T2R differential cells according to claim 1, the step of programming the initial codeword in the resistive memory in 1T1 R mode and/or the step of programming the inverted initial codeword in the resistive memory in 1T1R mode comprising substeps of:
reading, in 1T1 R mode, from the resistive memory, the bits at the programming address of the codeword and comparing the bits read at said programming address and the bits of the codeword to be programmed, and programming, in 1T1R mode, in the resistive memory, only the bits of the codeword that do not correspond to the read bits.

7. The method for writing a data word to a resistive memory consisting of 2T2R differential cells according to claim 1, the step of programming the initial codeword in the resistive memory in 1T1R mode or the step of programming the inverted initial codeword in the resistive memory in 1T1 R mode being performed by a single write circuit designed to configure the cells of the resistive memory in an HRS or LRS state.

8. The method for writing a data word to a resistive memory consisting of 2T2R differential cells according to claim 1, the step of programming the initial codeword in the resistive memory in 1T1R mode and/or the step of programming the inverted initial codeword in the resistive memory in 1T1R mode being performed by a first write circuit designed only to configure the cells of the resistive memory in an HRS state and, in parallel, by a second write circuit designed only to configure the cells of the resistive memory in an LRS state.

9. The method for writing a data word to a resistive memory consisting of 2T2R differential cells according to claim 8, the step of programming the initial codeword in the resistive memory in 1T1 R mode and/or the step of programming the inverted initial codeword in the resistive memory in 1T1R mode being performed firstly by the first write circuit concerning the cells of the resistive memory to be programmed in a HRS state and then being performed secondly by the second write circuit concerning the cells of the resistive memory to be programmed in an LRS state, or vice versa.

10. A device for writing a data word to a resistive memory consisting of 2T2R differential cells each comprising first and second sets of a resistor (R) and a selection transistor (T), the device comprising means for implementing the steps of the write method according to claim 1.

11. The device for writing a data word to a resistive memory consisting of 2T2R differential cells according to claim 10, wherein the means comprise a memory controller coupled to the resistive memory designed to implement the check read operation in 2T2R differential mode step of the write method according to claim 1.

12. A device for writing a data word to a resistive memory consisting of 2T2R differential cells each comprising first and second sets of a resistor (R) and a selection transistor (T), the device comprising means for implementing the steps of the write method according to claim 1, wherein the means comprise a host processor coupled to the resistive memory designed to implement the check read operation in 2T2R differential mode step of the write method according to claim 1.

* * * * *